United States Patent [19]

Paski

[11] Patent Number: 4,583,007
[45] Date of Patent: Apr. 15, 1986

[54] FAILSAFE DECISION CIRCUIT

[75] Inventor: Robert M. Paski, Middletown, N.J.

[73] Assignee: AT&T Bell Laboratories, Murray Hill, N.J.

[21] Appl. No.: 775,703

[22] Filed: Sep. 13, 1985

Related U.S. Application Data

[63] Continuation of Ser. No. 495,067, May 13, 1983, abandoned.

[51] Int. Cl.[4] ............................................. H03K 5/01
[52] U.S. Cl. ................................... 307/268; 307/269; 328/164; 375/4; 375/108
[58] Field of Search ...................... 307/261, 268, 269; 328/162, 164; 375/4, 108

[56] References Cited

U.S. PATENT DOCUMENTS 2,942,196  6/1960  De Lange ............................ 328/164
3,488,526  1/1970  Bohrer et al. ....................... 328/164
3,518,456  6/1970  Mauduit et al. ..................... 328/164

OTHER PUBLICATIONS

"A Single Chip Regenerator for Transmission Systems Operating in the Range 2-320 Mbits/s", *IEEE Journal of Solid-State Circuits*, vol. SC-17, No. 3, Jun. 1982, pp. 553-558.

*Primary Examiner*—John Zazworsky
*Attorney, Agent, or Firm*—Richard B. Havill; Henry T. Brendzel; Daniel D. Dubosky

[57] ABSTRACT

A decision circuit is responsive to digital input signals and to timing signals for reshaping and retiming the input signals into reshaped and retimed output signals. The decision circuit also is responsive to the digital input signals and absence of the timing signals for reshaping but not retiming the digital input signals into reshaped output signals which are transmitted. Thus the circuit produces and transmits reshaped output signals even upon failure to apply the timing signals required by a prior art decision circuit.

4 Claims, 15 Drawing Figures

FAILSAFE DECISION CIRCUIT

This application is a continuation of application Ser. No. 495,067, filed May 13, 1983, now abandoned.

BACKGROUND OF THE INVENTION

The invention relates to a decision circuit that is more particularly described as a reshaping and retiming circuit which reshapes input pulses into squared-up output pulses even upon failure of timing signals.

In the prior art, a regenerator in a digital transmission system extracts timing or clock signals from a received data stream. The extracted timing signals are used for controlling the regeneration, that is, the reshaping and retiming of data bits being received. If the timing extraction arrangement fails for any reason, a problem arises in that the regenerator ceases to regenerate the received data bits. No output signals are transmitted further along the line.

In the prior art, a regenerator makes a binary decision concerning the amplitude of a received digital signal with respect to a predetermined threshold level at an optimum sampling instant. In response to the received data signal and an extracted timing signal, a prior art decision circuit in the regenerator reshapes and retimes the received signal into a regenerated, or reshaped and retimed, output signal. This regenerated output signal, with as little distortion as possible, is applied to a modulator for shaping an output signal to be transmitted further along the transmission line.

The prior art decision circuit functions in response to a timing signal that is extracted from the received stream of data bits. A problem occurs if the timing extraction circuit fails to extract the timing signal from the received stream of data bits. The problem is that without application of the timing signal the prior art decision circuit ceases to reproduce and retransmit the received data signals.

SUMMARY OF THE INVENTION

This problem is solved by a regenerator including a decision circuit responsive to digital input signals for reshaping and retiming the input signals into reshaped and retimed output signals. The decision circuit also is responsive to the digital input signals and absence of the timing signals for reshaping but not retiming the digital input signals into reshaped output signals which are transmitted. Thus the circuit produces and transmits reshaped output signals even upon failure of the timing signals required by the prior art decision circuit.

BRIEF DESCRIPTION OF THE DRAWING

A better understanding of the invention may be derived by reading the following detailed description with reference to the appended drawing wherein.

DETAILED DESCRIPTION

Figure 1:
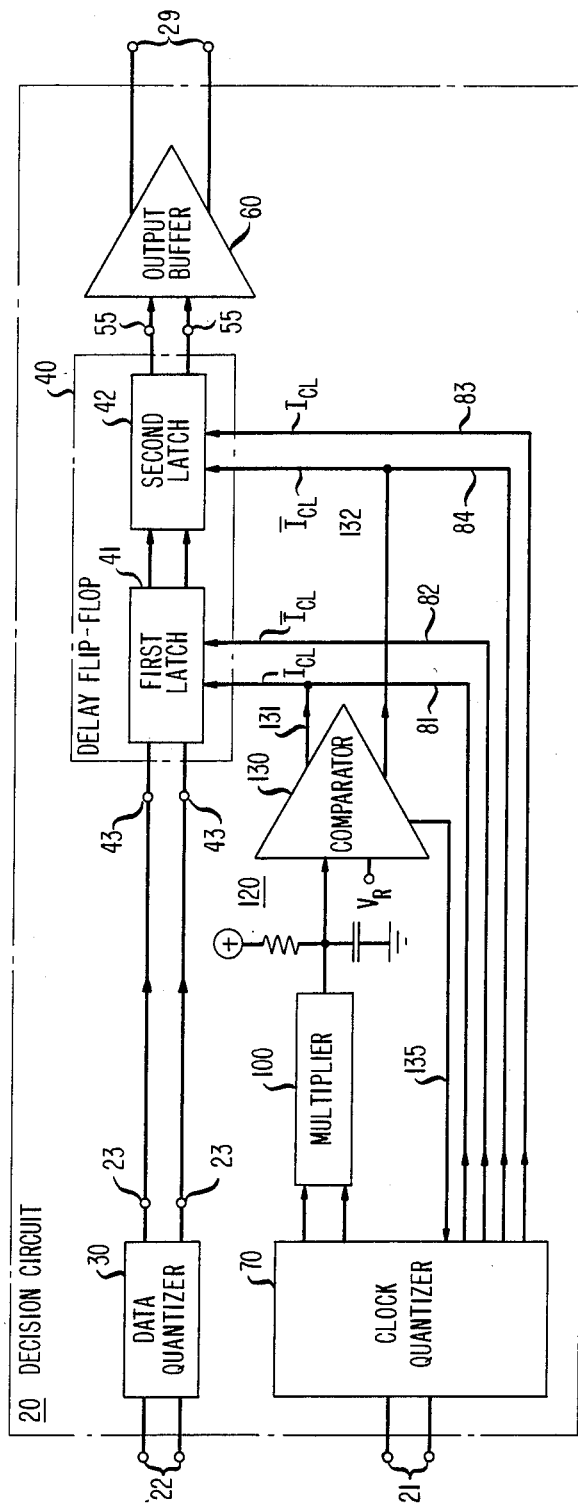
FIG. 1 is a block diagram of a decision circuit embodying the invention.

Referring now to FIG. 1, there is shown a decision circuit 20 that is responsive to either single-ended or balanced input signals applied to data input terminals 22. The decision circuit also is responsive to recovered input clock, or timing, signals which are applied to input clock terminals 21. The decision circuit 20 is arranged for reshaping and retiming the input data signals into regenerated output data signals which are produced on output data terminals 29.

Decision circuit 20 not only regenerates the input data signals during normal operation, but it also continues to produce an output data stream in the event that the recovered input clock signals are not applied to the circuit 20. Thus the decision circuit safely continues to produce a reshaped but not a retimed output data stream when the clock, or timing, signals fail to be applied. This is very advantageous for use in a very long relatively inaccessible cable system requiring regeneration, such as in an undersea optical fiber transmission system.

As shown in FIG. 1, the decision circuit includes several circuit blocks. Those blocks include a data quantizer 30, a delay flip-flop 40, and an output buffer 60 for reshaping and retiming the input data signals into the regenerated output data signals produced at output terminals 29. The output data signals are produced so that they are useable as either single-ended or balanced output signals. The several circuit blocks are shown in greater detail in other figures of the drawing. Operation of the circuits of those figures are to be described subsequently as we progress through the functions of the decision circuit 20 in response to a stream of input data signals. Also included in those blocks of FIG. 1 are a clock quantizer 70, a multiplier 100, a low-pass filter 120, and a comparator 130 for retiming the input data signals when the clock pulse is being applied and for assuring a continued reshaping of the input pulses when no timing pulses are applied.

Figure 2:
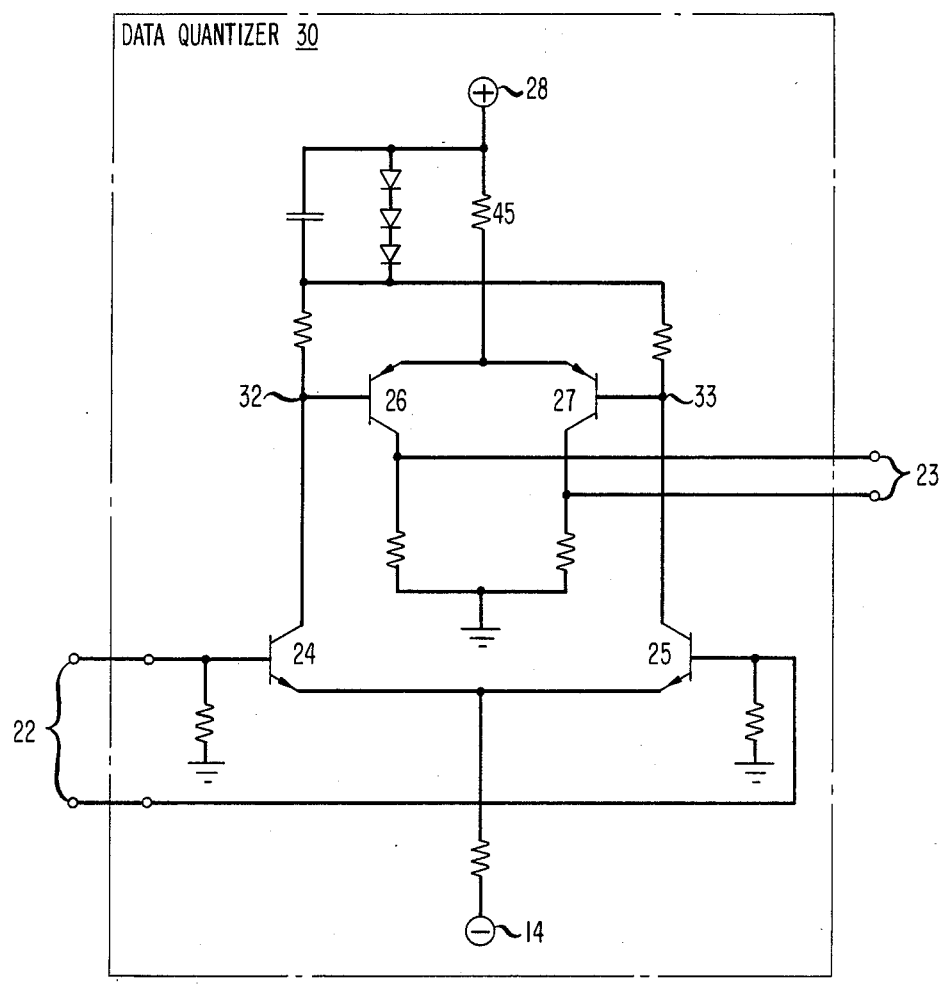
FIG. 2 is a schematic diagram of a data quantizer used in the block diagram of FIG. 1.

Refer now to FIG. 2 which presents a schematic diagram of the data quantizer 30. The input data signals are applied to the data input terminals 22. Quantized signals are produced on output terminals 23 of the data quantizer.

Figure 3:
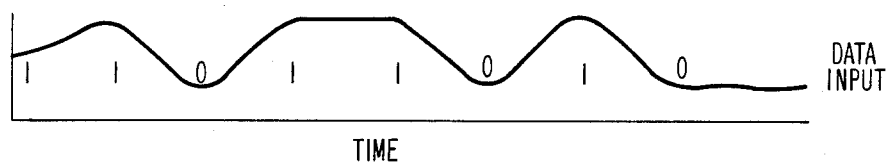
FIG. 3 is a waveform showing an exemplary input data stream being applied to the quantizer of FIG. 2.

As shown in FIG. 3, a waveform representative of an input data stream is in a non-return-to-zero format having a Nyquist pulse shape. Binary digits are presented in FIG. 3 to clearly define the binary data being represented by the waveform during the different time slot intervals.

Figure 4:
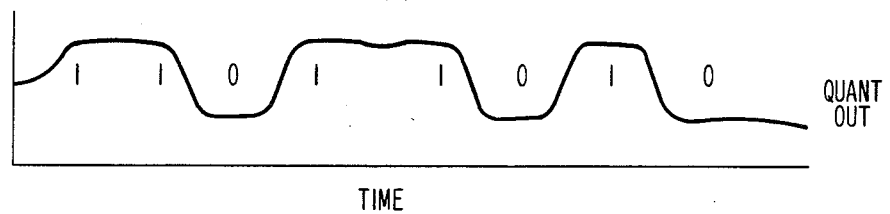
FIG. 4 is a waveform of a quantized version of the exemplary input data stream of FIG. 3 which is being applied to the quantizer of FIG. 2.

FIG. 4 shows the corresponding waveform resulting at the output terminals 23 in response to the input data shown in FIG. 3.

In operation the data quantizer of FIG. 2 functions as two emitter-coupled pairs of transistors. An input pair of NPN transistors 24 and 25 is biased to operate for full amplitude input signals in the nonlinear region of its characteristic curves without putting either of those transistors into saturation. The input pair of transistors produces at nodes 32 and 33 complementary signals which are applied to an output pair of PNP transistors 26 and 27. Transistors 26 and 27 also are biased to operate in a nonlinear region of their characteristic curves without going into saturation. The arrangement and operation of the data quantizer are disclosed in greater detail in a now abandoned U.S. patent application, Ser. No. 495,061, which was filed May 13, 1983 in the name of R. M. Paski.

FIG. 4 shows a waveform which is produced at the output terminals 23 of the data quantizer 30 of FIG. 2 and which represents a quantized version of the input data stream. It is noted that some slight delays occur between the waveform of FIG. 3 and the waveform of FIG. 4.

Figure 5:
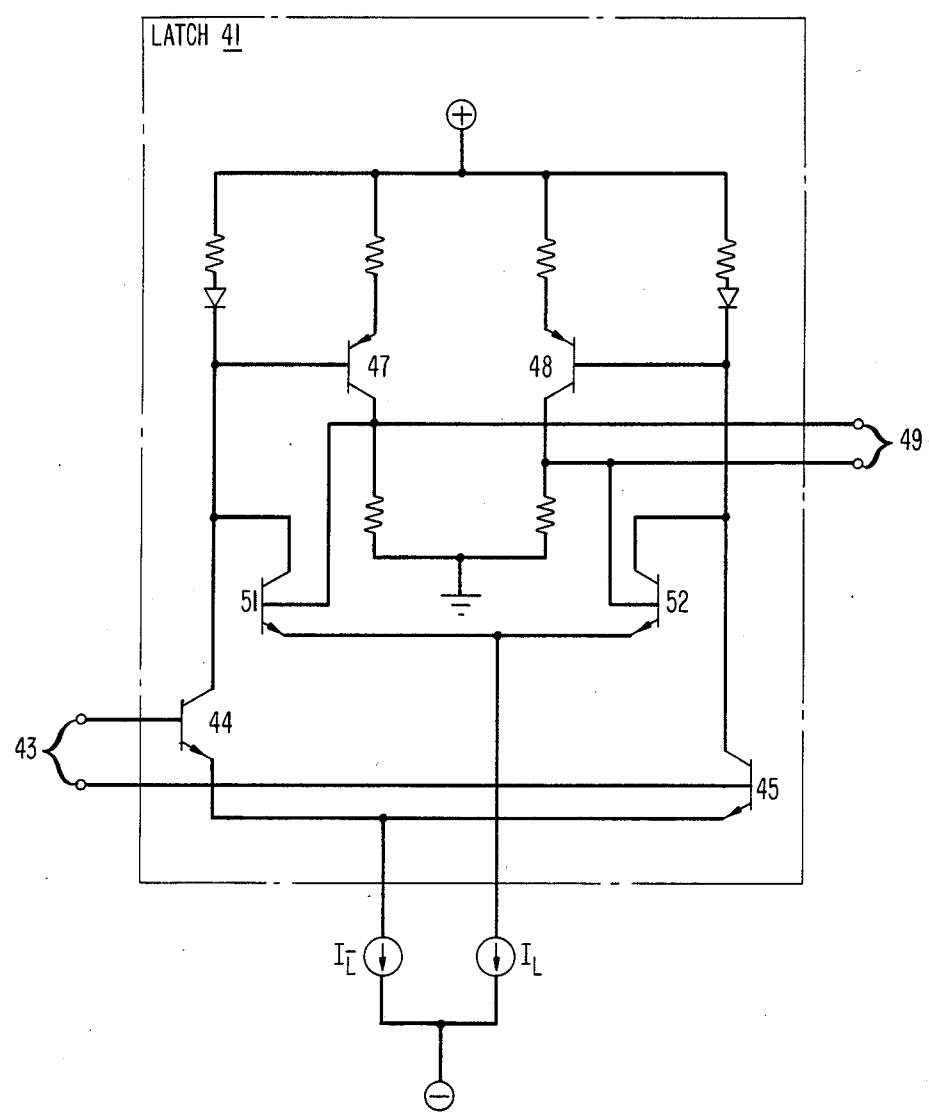
FIG. 5 is a schematic diagram of a latch circuit used in the block diagram of FIG. 1.

Referring now to FIG. 5, there is shown a latch circuit 41 which is suitable for use for both the first latch circuit 41 and the second latch circuit 42 in the delay flip-flop 40 of FIG. 1. Balanced signals from the output terminals 23 of the data quantizer 30 of FIG. 2 are applied to input terminals 43 of the latch circuit 41.

There are three operating sections of the latch circuit 41. An input pair of emitter-coupled NPN transistors 44 and 45 has a nonlatch current $I_L$ as its common emitter current source. Output transimpedance circuits including PNP transistors 47 and 48, which are opposite conductivity type devices from the input pair of transistors, produce complementary output signals on a pair of output terminals in response to the quantized version of the input data stream. A latching pair of emitter-coupled NPN transistors 51 and 52 has a latch current $I_L$ as its common emitter current source. The arrangement and operation of the latch circuit 41 are disclosed in greater detail in a U.S. patent Ser. No. 495,063 which was filed May 13, 1983 in the name of R. M. Paski.

Referring once again to FIG. 1, the second latch circuit 42 is similar to the first latch circuit 41 just described. In the delay flip-flop 40, the signals produced on the output terminals of the first latch circuit 41 are applied as balanced input signals to the input terminals of the second latch circuit 42. Output signals produced by the second latch circuit 42 also are the balanced output of the delay flip-flop 40. Because complementary bipolar transistors are used in the latching circuits, no level shifting circuitry is required.

Figure 6:
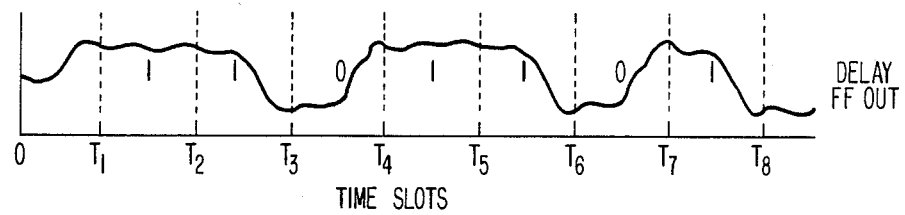
FIG. 6 is a waveform of a delayed, or regenerated, version of the quantized data stream.

Referring now to FIG. 6, there is shown a waveform of the output bit stream from the delay flip-flop 40 of FIG. 1 in response to the stream of data bits applied from the output of the data quantizer 30 and in response to clock signals from the clock quantizer 70, to be described subsequently herein. It is noted that the quantized output is delayed a half of a bit time slot so that the input data signal, applied to the delay flip-flop, is not directly available at the output terminals 55 of the delay flip-flop while the clock is running. The output data stream from the delay flip-flop 40 represents a reshaped and retimed version of the input data signals applied to the data input terminals 22.

Most of the time during operation of the decision circuit 20, a clock input signal is extracted from the received stream of data bits. This clock input signals is applied to the input terminals 21 of the clock quantizer circuit 70 for the purpose of controlling the retiming of the output data signals which are produced by the delay flip-flop 40 of FIG. 1.

Figure 8:
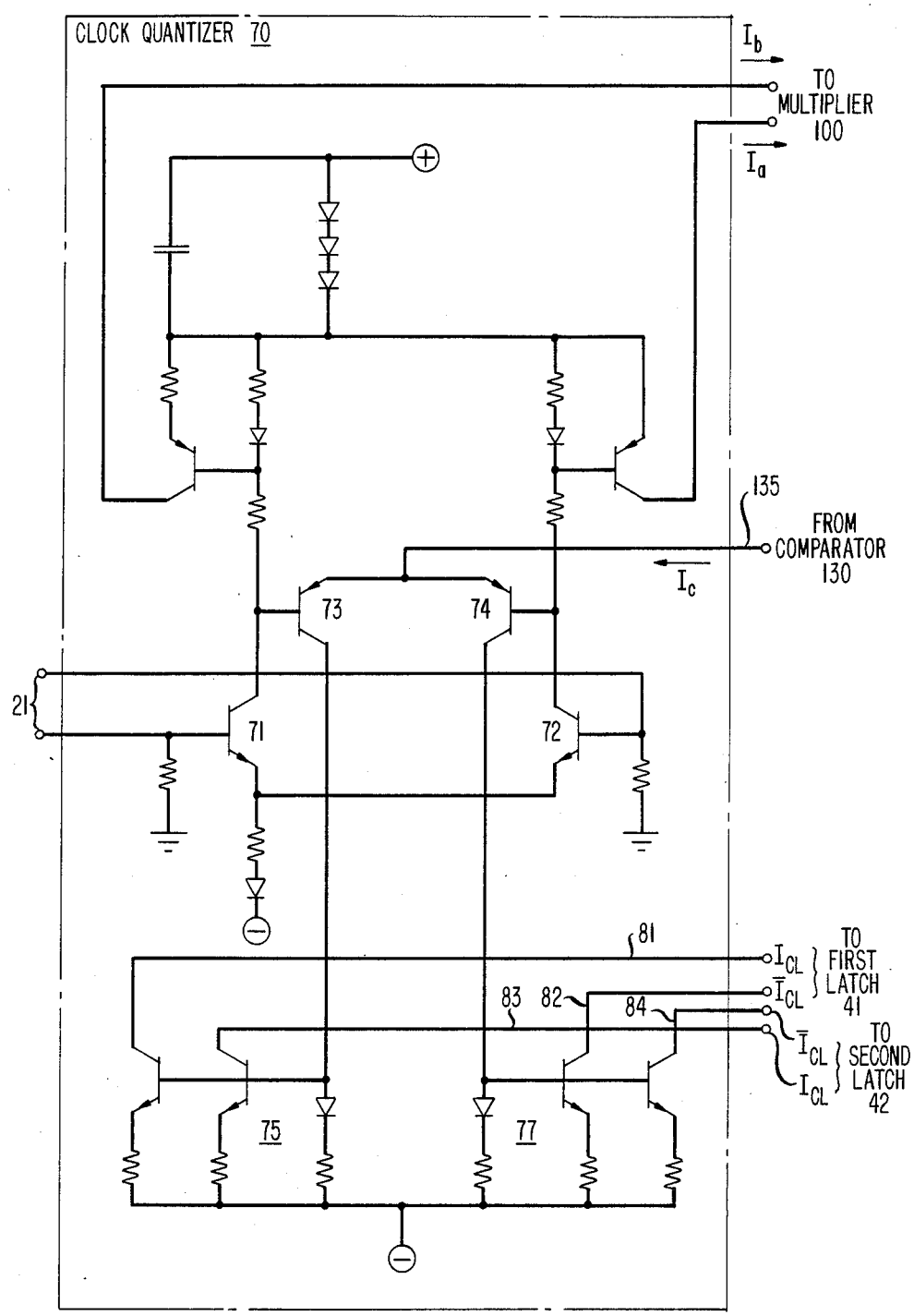
FIG. 8 is a clock quantizer circuit used in the decision circuit of FIG. 1.

Referring now to FIG. 8, there is shown a schematic diagram of a clock quantizer circuit 70 that is suitable for use in the decision circuit 20. This circuit 70 is similar in many respects to the data quantizer of FIG. 2. The clock quantizer circuit 70 of FIG. 8 includes an input pair of emitter-coupled NPN transistors 71 and 72 and an output pair of emitter-coupled transistors 73 and 74.

Figure 9:
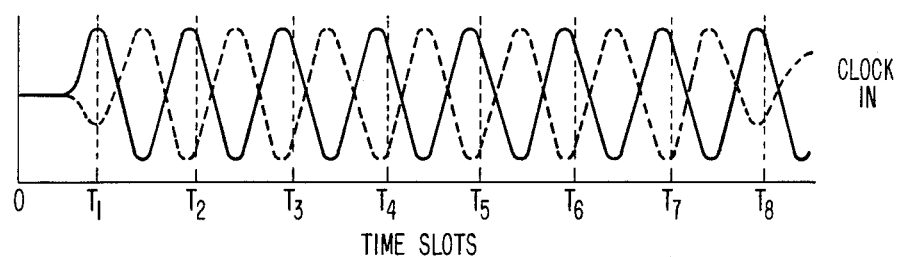
FIG. 9 is a waveform of an input clock signal that is applied to the clock quantizer of FIG. 8.

In FIG. 9 there is shown a waveform representing a clock input signal being applied to the clock input terminals 21 of FIGS. 1 and 8. The output pair of transistors 73 and 74 produce a quantized clock signal current at their collector electrodes. The collector currents of the transistors 73 and 74 are conducted into the inputs of current mirrors 75 and 77, respectively.

Since the currents in the collectors of the output pair of transistors 73 and 74 are complementary, the output currents through the diode and resistor combinations produce complementary output currents through two groups of transistors and output terminals 81, 82 and 83, 84. Each clock output current $I_{CL}$ or $\bar{I}_{CL}$ from the clock quantizer 70 is produced by a current mirror arrangement that reflects the current from one side of the output pair of emitter coupled transistors 73 and 74.

These clock output currents provide the complementary clock drive currents to the common emitter circuits of the input and output pairs of emitter-coupled transistors in the first and second latch circuits. These complementary clock drive currents $I_{CL}$ and $\bar{I}_{CL}$ are conducted alternately through the common emitter circuits of the input and output pairs of transistors in the latch circuits 41 and 42.

While the input clock signals are functioning correctly, there are two latch circuits 41 and 42 that are sampling and holding the input data that is applied through the terminals 43. Those latch circuits retime and reshape the data into a regenerated output data stream. Both latch circuits repeatedly switch between their latched and unlatched states, however, they are in opposite phase from each other.

In operation each latch circuit retimes and reshapes one half of every data bit. During a first half time slot when the first latch circuit 41 is in its unlatched state, an unretimed and unreshaped half of a first data pulse is passed to the second latch circuit 42. At that time the second latch circuit 42 is in its latch state which retains a prior input data pulse. During a second half time slot, the first latch circuit 41 is in its latching state so it retimes and reshapes the second half of the first data pulse. Concurrently during the second half time slot, the second latch circuit 42 is in its unlatched state so it passes to the output terminals the retimed and reshaped second half of the first data pulse. During a third half time slot, the first latch circuit 41 is unlatched. It passes one half of a second input data pulse to the second latch circuit 42. At that time, the second latch circuit 42 is in its latched state which retains the output of the first data pulse for another half of a time slot.

Thus the second latch circuit 42 produces fully retimed and reshaped output pulses from its output terminals 55. One half of each output pulse is retimed and reshaped in the first latch circuit 41 and is simply passed through the second latch circuit 42. The other half of each output pulse is retimed and reshaped by the second latch circuit 42 thus extending the output pulse width.

Figure 11:
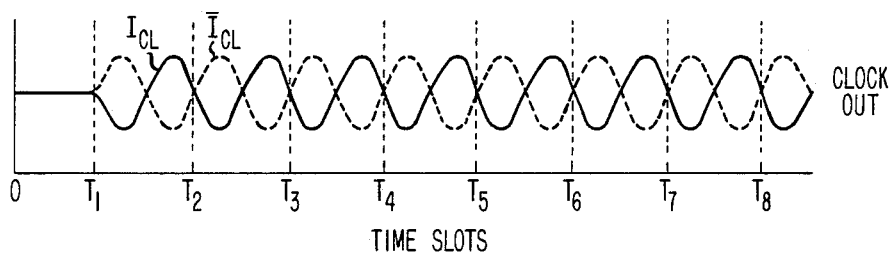
FIG. 11 is an output clock signal produced by the clock quantizer of FIG. 8.

Referring now to FIG. 11, there is shown, as a solid line, a representative waveform of the output clock signal $I_{CL}$. The complementary output clock signal $\bar{I}_{CL}$ is shown dotted also in FIG. 11.

The foregoing description presents the operation of the decision circuit during normal operation while the input clock signal is being applied to the terminals 21 in FIGS. 1 and 8.

In FIG. 1 the multiplier 100, the filter 120 and the comparator 130 are arranged to respond to the quantized clock signal currents produced by the input pair of transistors 71 and 72 of the clock quantizer 70 and applied by the clock quantizer 70 to the multiplier 100, as shown in FIG. 1. These quantized clock currents are mirrored within the clock quantizer to the inputs of the multiplier 100, as shown in FIG. 8.

Figure 10:
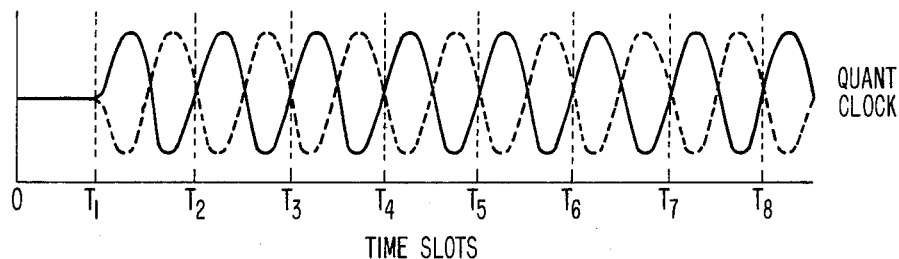
FIG. 10 is the quantized version of the input clock signal of FIG. 9.

FIG. 10 shows a representative waveform of the quantized clock currents applied to the multiplier 100.

Figure 12:
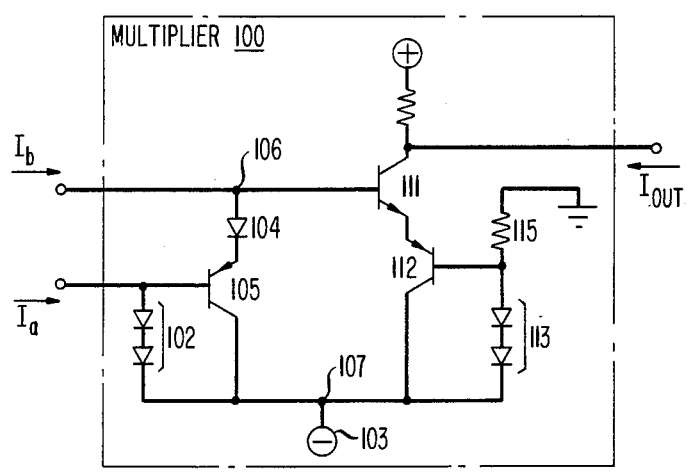
FIG. 12 is a schematic diagram of a multiplier circuit used in the block diagram of FIG. 1.

Referring now to FIG. 12, the multiplier 100 is shown as an arrangement for producing an output current $I_{OUT}$ which is the product of two input currents $I_a$ and $I_b$. Substantially all of the current $I_a$ is conducted through a pair of diodes 102 to a source 103 of negative polarity bias potential. The voltage produced across the diodes 102 is a logarithmic function of the current $I_a$. Substantially all of the current $I_b$ is conducted through a diode 104 and a transistor 105 to the bias source 103. The voltage produced across the diode 104 and the emitter-base junction of the transistor 105 is a logarithmic function of the current $I_b$.

The two logarithmic function voltages are summed between nodes 106 and 107.

An output circuit arrangement of a pair of transistors 111 and 112 and a pair of diodes 113 produce the output current $I_{OUT}$ which is an antilogarithmic function of the voltage between the nodes 106 and 107. A resistor 115 is selected so that the current through the diodes 113 allows the diodes to operate in their logarithmic range.

Because of the sum of the logarithmic functions on the input side of the multiplier and the antilogarithmic function on the output side of the circuit, the output current $I_{OUT}$ is a function of the product of the input currents $I_a$ and $I_b$. A more detailed description of the multiplier circuit is presented in U.S. patent application, Ser. No. 337,706, whch was filed Jan. 7, 1982 in the name of D. G. Ross.

Figure 13:
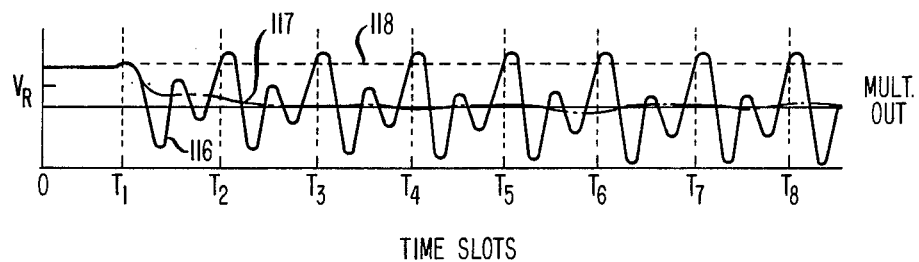
FIG. 13 is a waveform of the output of the multiplier circuit used in the decision circuit of FIG. 1.

Referring now to FIG. 13, there is shown a typical output waveform 116 produced by the multiplier 100 of FIG. 1. This waveform is applied to low-pass filter 120, which produces a mean value signal 117 from the multiplier output waveform 116.

Figure 14:
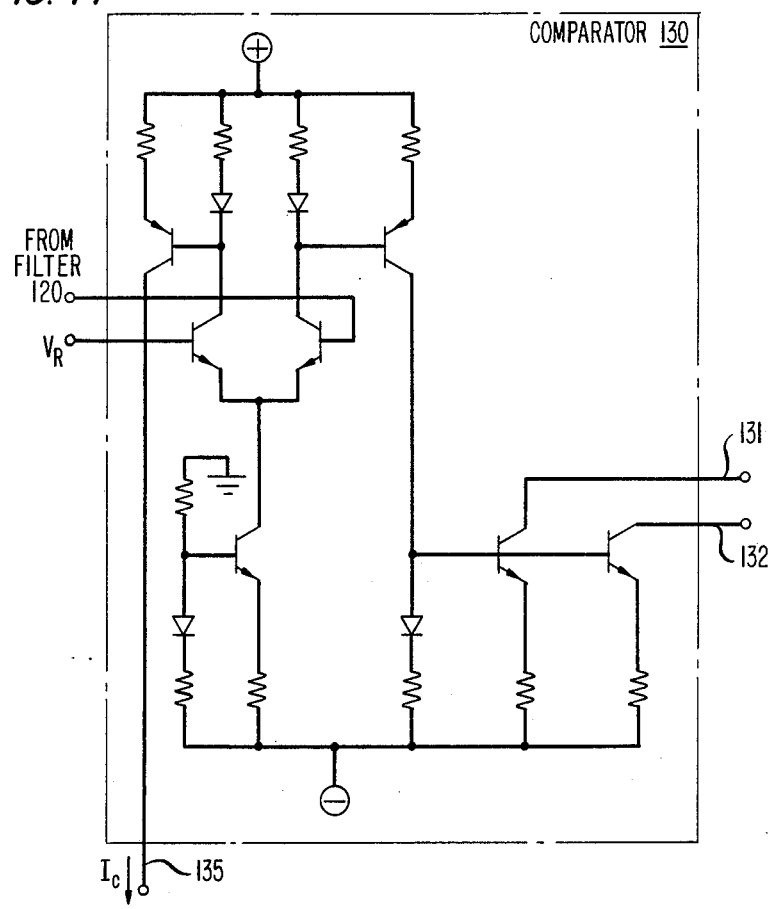
FIG. 14 is a schematic diagram of a comparator circuit used in the block diagram of FIG. 1.

Referring now to FIG. 14, there is shown a schematic of the comparator 130 of FIG. 1 which responds to the amplitude of the mean value signal 117 from the filter 120 comparing the mean value signal to a reference voltage $V_R$. During normal operation, the amplitude of the mean value signal is shown at a steady value below the reference voltage $V_R$ in FIG. 13. No output current is conducted through output leads 131 and 132 to the first and second latch circuits of FIG. 1. When the input clock signal fails in part or entirely, the filtered multiplier output swings to a failure value shown as a dotted waveform 118 in FIG. 13. Comparator 130 of FIG. 14, which supplies no current through output leads 131 and 132 to the first and second latch circuits 41 and 42 during normal clock operation, now supplies emitter current to the input, or nonlatching, pairs of transistors of both latch circuits 41 and 42.

When the clock signal fails, there is in FIG. 8 a change in a clock control current $I_C$ produced by the comparator 130 of FIG. 1 and connected with the common emitter circuits of the output pair of transistors 73 and 74 of the clock quantizer 70. During normal operation, control current $I_C$ is conducted through a lead 135 from the output of the comparator 130 to the clock quantizer 70 of FIG. 8. The control current $I_C$ is conducted when a clock signal of predetermined sufficient amplitude is applied to the clock input terminals 21. The mean value of the output waveform 117 from the multiplier remains below the reference voltage $V_R$, as shown in FIG. 13. When the clock signal applied to the terminals 21 falls below the predetermined level, no clock control current $I_C$ is conducted from the comparator to the clock quantizer. As shown in FIG. 13, the filtered multiplier output crosses above the reference level $V_R$ upon failure of the input clock signal.

Advantageously when the input clock signal fails, the decision circuit continues to reshape any stream of data pulses applied to the data input terminals 22. The clock quantizer no longer supplies emitter current to the input, or latching, pairs of transistors in the latches 41 and 42. By way of the output leads 131 and 132, the comparator 130 supplies emitter current to the input, or nonlatching, pairs of transistors in the latches 41 and 42. Under these circumstances, each latch circuit no longer latches the data but operates somewhat like the quantizer circuit of FIG. 2 with less gain. The previously mentioned half a time slot delay in the output of the delay flip-flop 40 does not occur.

Input data signals are reshaped effectively through a cascade of the quantizer circuit 30 and the two latch circuits 41 and 42 operating somewhat like the quantizer circuit. Output signals produced on terminals 55 by the latch circuit 42 are buffered through the output buffer circuit 60 to the data output terminals 29.

Figure 7:
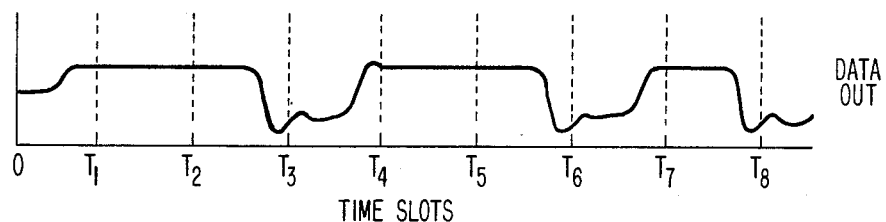
FIG. 7 is a waveform of an output data stream produced by the decision circuit of FIG. 1.

FIG. 7 shows a representative waveform of regenerated output signals which appear on output terminals 29 of FIG. 1.

Figure 15:
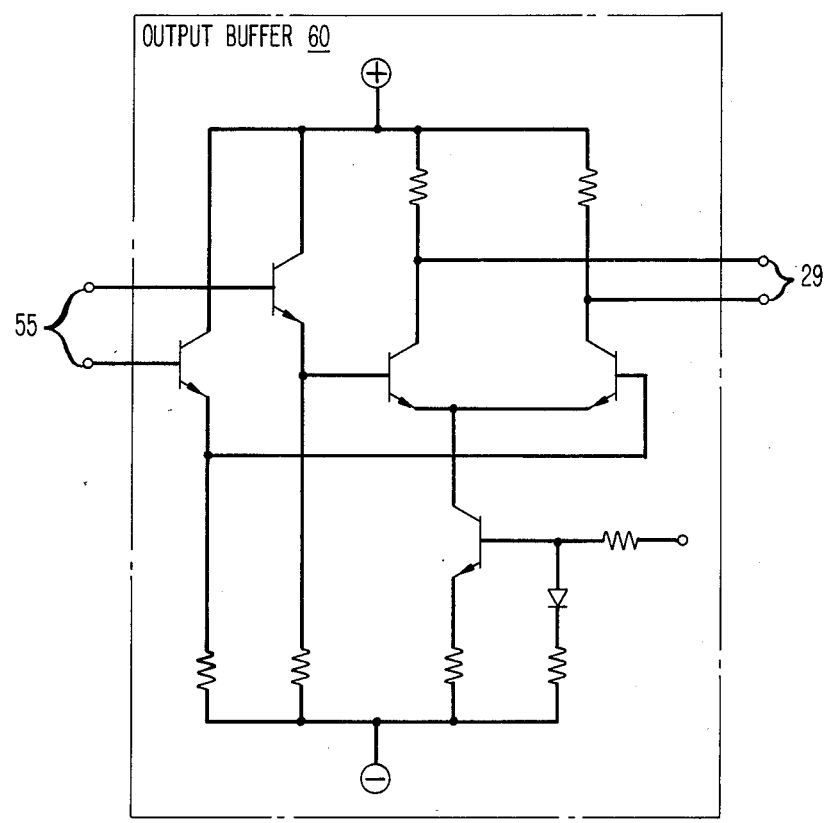
FIG. 15 is a schematic diagram of a buffer circuit used in the block diagram of FIG. 1.

FIG. 15 shows a buffer circuit arrangement suitable for use as the output buffer 60 of FIG. 1. The resulting output signals thus are reshaped but not retimed while the clock signal is failed. Although the quality of the data stream is reduced by the lack of retiming, the output data stream can be applied to a transmitter for continuing operation of the transmission system in spite of the clock failure. The transmitted data stream received at the next subsequent regenerator will be both reshaped and retimed therein.

It is advantageous to fabricate the failsafe decision circuit 20 as an integrated circuit. There are known processes for fabricating the opposite conductivity type transistors as a monolithic integrated circuit capable of operating at frequencies as high as the microwave frequency range. One process which can be used for making the circuit is a process described in a now abandoned U.S. patent application Ser. No. 658,586, filed on Feb. 17, 1976 in the names of W. E. Beadle, S. F. Moyer and A. A. Yiannoulos and entitled "Integrated Complementary Vertical Transistors." Another process which can be used for making the circuit is a slightly modified version of the just mentioned process, which is described in a U.S. patent application, Ser. No. 337,707, filed Jan. 7, 1982 in the name of D. G. Ross.

The foregoing describes an embodiment of the invention. The described embodiment and others which are obvious in view thereof are considered to be within the scope of the invention.

What is claimed is:

1. A decision circuit for reshaping data signals in the presence and absence of timing signals comprising
    clock means responsive to said timing signals for generating periodic clock signals, and
    processing means responsive to said data signals and said periodic clock signals for generating reshaped and retimed data signals,
    characterized in that:
        said clock means includes means responsive to the absence of said timing signals for generating an output current, and means for coupling said output current to said processing means whereby said processing means generates reshaped data signals.

2. A decision circuit, in accordance with claim 1, wherein said clock means further includes
    means responsive to said timing signals for producing a quantized timing signal and its complement.

3. A decision circuit, in accordance with claim 2, wherein said means for generating an output current includes means responsive to said quantized timing signal and its complement for producing a product signal;
    means responsive to said product signal for developing a substantially constant voltage of one value when said timing signals are present and of a second value when said timing signals are absent; and
    comparator means responsive to said substantially constant voltage of said second value for generating said output current.

4. A decision circuit, in accordance with claim 1, wherein the decision circuit is fabricated with opposite conductivity type transistors as a monolithic integrated circuit.

* * * * *

UNITED STATES PATENT AND TRADEMARK OFFICE
CERTIFICATE OF CORRECTION

PATENT NO. : 4,583,007

DATED : April 15, 1986

INVENTOR(S) : Robert M. Paski

It is certified that error appears in the above-identified patent and that said Letters Patent is hereby corrected as shown below:

Column 3, line 36, "$I_L$" should read --$I_{\overline{L}}$--.

Column 3, line 46, after "U.S. patent" insert --application--.

Signed and Sealed this

Twelfth Day of August 1986

[SEAL]

Attest:

DONALD J. QUIGG

Attesting Officer

Commissioner of Patents and Trademarks